United States Patent
Suzuki et al.

(10) Patent No.: US 10,268,117 B2
(45) Date of Patent: Apr. 23, 2019

(54) TOP-LAYER MEMBRANE FORMATION COMPOSITION AND METHOD FOR FORMING RESIST PATTERN USING SAME

(71) Applicant: AZ Electronic Materials (Luxembourg) S.a.r.l., Luxembourg (LU)

(72) Inventors: Masato Suzuki, Kakegawa (JP); Xiaowei Wang, Kakegawa (JP); Tetsuo Okayasu, Kakegawa (JP); Yusuke Hama, Kakegawa (JP); Georg Pawlowski, Tokyo (JP)

(73) Assignee: AZ Electronic Materials (Luxembourg) S.a.r.l. (LU)

( * ) Notice: Subject to any disclaimer, the term of this patent is extended or adjusted under 35 U.S.C. 154(b) by 16 days.

(21) Appl. No.: 15/312,442

(22) PCT Filed: May 19, 2015

(86) PCT No.: PCT/JP2015/064362
§ 371 (c)(1),
(2) Date: Nov. 18, 2016

(87) PCT Pub. No.: WO2015/178387
PCT Pub. Date: Nov. 26, 2015

(65) Prior Publication Data
US 2017/0090288 A1    Mar. 30, 2017

(30) Foreign Application Priority Data

May 21, 2014    (JP) .................................. 2014-105511

(51) Int. Cl.
| | | |
|---|---|---|
| G03F 7/30 | (2006.01) | |
| G03F 7/004 | (2006.01) | |
| G03F 7/11 | (2006.01) | |
| G03F 7/20 | (2006.01) | |
| C09D 7/63 | (2018.01) | |
| C09D 5/32 | (2006.01) | |
| G03F 7/16 | (2006.01) | |
| G03F 7/32 | (2006.01) | |
| H01L 21/027 | (2006.01) | |
| G03F 7/09 | (2006.01) | |
| C08K 5/13 | (2006.01) | |

(52) U.S. Cl.
CPC ................. *G03F 7/30* (2013.01); *C09D 5/32* (2013.01); *C09D 7/63* (2018.01); *G03F 7/091* (2013.01); *G03F 7/11* (2013.01); *G03F 7/162* (2013.01); *G03F 7/168* (2013.01); *G03F 7/2004* (2013.01); *G03F 7/2041* (2013.01); *G03F 7/322* (2013.01); *H01L 21/0274* (2013.01); *C08K 5/13* (2013.01)

(58) Field of Classification Search
CPC ... G03F 7/38; G03F 7/091; G03F 7/11; G03F 7/30; G03F 7/2041
USPC .......................... 430/326, 330, 270.1, 273.1
See application file for complete search history.

(56) References Cited

U.S. PATENT DOCUMENTS

| | | | |
|---|---|---|---|
| 3,640,718 A * | 2/1972 | Smith | G03C 1/675 430/270.1 |
| 6,720,124 B2 | 4/2004 | Takashima et al. | |
| 8,889,344 B2 * | 11/2014 | Prokopowicz | G03F 7/091 430/271.1 |
| 9,482,952 B2 | 11/2016 | Wang et al. | |
| 2005/0008864 A1 | 1/2005 | Ingen Schenau et al. | |
| 2012/0021355 A1 | 1/2012 | Kim et al. | |
| 2012/0225386 A1 * | 9/2012 | Watanabe | G03F 7/0045 430/285.1 |
| 2013/0052585 A1 * | 2/2013 | Ayothi | C07D 241/04 430/283.1 |
| 2014/0242526 A1 * | 8/2014 | Allen | G03F 7/325 430/326 |
| 2015/0140490 A1 | 5/2015 | Wang et al. | |

FOREIGN PATENT DOCUMENTS

| | | |
|---|---|---|
| JP | S62226141 A | 10/1987 |
| JP | 2003050442 A | 2/2003 |
| JP | 2004348133 A | 12/2004 |
| JP | 2008046206 A | 2/2008 |
| JP | 2008065304 A | 3/2008 |
| JP | 2014178573 A | 9/2014 |
| WO | WO-2008146626 A1 | 12/2008 |
| WO | WO-2013183686 A1 | 12/2013 |

OTHER PUBLICATIONS

International Search Report for PCT/JP2015/064362 dated Jul. 7, 2015.

* cited by examiner

*Primary Examiner* — John S Chu
(74) *Attorney, Agent, or Firm* — Drinker Biddle & Reath LLP

(57) ABSTRACT

[Object] To provide compositions for forming a top coat layer capable of forming patterns with an excellent roughness and pattern shape in a pattern formation method by exposure to extreme ultraviolet rays, and a pattern formation method using the composition.
[Means for solving problem] Provided are compositions for forming a top coat layer comprises an aromatic compound having an aromatic hydroxyl group and an aqueous solvent; and a method of forming patterns by applying the composition onto the resist surface and subjecting the resultant to exposure and development. This composition can further comprise binders.

19 Claims, No Drawings

TOP-LAYER MEMBRANE FORMATION COMPOSITION AND METHOD FOR FORMING RESIST PATTERN USING SAME

CROSS-REFERENCE TO RELATED APPLICATIONS

This application is a national stage application (under 35 U.S.C. § 371) of PCT/JP2015/064362, filed May 19, 2015, which claims benefit of Japanese Application No. 2014-105511, filed May 21, 2014, both of which are incorporated herein by reference in their entirety.

BACKGROUND OF THE INVENTION

Technical Field

The present invention relates to compositions for forming a top coat layer that are used in a photolithography method. To be more specific, the invention relates to a composition for forming a top coat layer that is formed on a resist layer prior to exposure of the resist layer for extreme ultraviolet rays in cases where an attempt to form resist patterns is made by the photolithography method. Further, the present invention relates to a pattern formation method using such composition for forming a top coat layer.

Background Art

As the size of various devices is becoming smaller, higher integration of semiconductor integrated circuits are demanded these days. In order to response to that, finer resist patterns have been demanded as well. In order to meet such needs, it is necessary to exposure using light with a shorter wavelength in the photolithography method. Thus, the light employed has become one with a shorter wavelength. As a result, visible light to ultraviolet rays and far ultraviolet rays can be used. Even extreme ultraviolet rays come to be used. Because ultrafine patterns are required to be formed in manufacturing process of semiconductor devices such as IC or LSI, to be more specific, DRAM, flash memory or logic-based semiconductor, photolithography by extreme ultraviolet rays is becoming more important.

In response to this, various resist compositions have been developed, which resist compositions have a sensitivity to light with different wavelengths. Here, it has been thought that almost all conventional commercially-available chemically amplified resists can be used in the photolithography method using extreme ultraviolet ray. Specifically, commonly-used resists for KrF laser exposure or resists for ArF laser exposure have been considered to be usable also in photolithography involving exposure to extreme ultraviolet rays. In practice, however, a large number of problems such as resolution, sensitivity, or roughness remain to be desirably improved in a current situation.

Meanwhile, there also remain problems in terms of a source of light and a mask in an exposure apparatus, which has caused delay in putting photolithography methods using extreme ultraviolet rays into practical use. Light with long wavelength contained in a source of extreme ultraviolet rays, in particular, deep ultraviolet light, for example, light with a wavelength 193 nm and 248 nm has been recognized as an important cause ascribed to deterioration of shape of resist patterns. As mentioned above, in cases where the resist composition for KrF laser or for ArF laser are employed in the photolithography method using extreme ultraviolet rays, it is obvious that these resists also exhibit a high sensitivity to deep ultraviolet rays.

Because of this, in cases where the pattern is formed by the photolithography method using extreme ultraviolet rays, a source of light with less content of such deep ultraviolet rays is desired. In order to remove the deep ultraviolet ray out of light irradiated from a exposure apparatus, a method of generating extreme ultraviolet rays is adjusted, for example, an optics system is adjusted. It is, however, difficult to completely remove the deep ultraviolet ray in a conventional source of exposure light; and it has been failed to keep the content of the deep ultraviolet ray contained in the extreme ultraviolet ray not more than 3% in a conventional exposure apparatus. As just described, the deep ultraviolet ray contained in extreme ultraviolet ray is a factor that causes deterioration of resist pattern roughness and deterioration of pattern shape; and a means to improve such problems has been sought.

Further, the exposure by extreme ultraviolet rays is in general carried out in high vacuum conditions. Because of this, upon the exposure in the photolithography method, each of the components of compositions such as photosensitive materials or photo acid generators that are contained in the resist layer, or low molecular weight compounds formed by a photoreaction often volatilize as gas. Such gas is referred to as outgas and may contaminate the optics system such as mirrors, photo masks, or the like in the exposure apparatus, resulting in deteriorated exposure accuracy. It has therefore been desired to inhibit the gas volatilizing for the resist as well.

For these problems, what has been develop is a method of forming a top coat layer on a resist layer, which top coat layer inhibits release of gas out of the resist layer and passes through extreme ultraviolet rays but absorbs deep ultraviolet light (Patent Document 1). Polymers that can be used for such a top coat layer and absorb deep ultraviolet rays have also been studied. That is, for the purpose of enhancing the top coat layer's effect of absorbing the deep ultraviolet ray, polymers having benzene, naphthalene or anthracene backbones were used (Patent Document 2). And, for the purpose of more enhancing the absorption of deep ultraviolet ray, studies have been conducted on search for polymer types and combination of polymers.

PRIOR ART DOCUMENTS

Patent Documents

Patent Document 1: Japanese Patent Application Laid-Open Publication No. 2004-348133
Patent Document 2: US Patent No. 2012/21355

DISCLOSURE OF INVENTION

Problems to be Solved by the Invention

However, a top coat layer with greater effects of absorbing deep ultraviolet ray, as compared to top coat layers that have been thus far proposed, have been sought.

Means for Solving the Problems

The composition for forming a top coat layer according to the present invention is for forming a top coat layer formed on the upper side of a resist layer and comprises an aromatic compound with molecular weight of 180 to 800 having an aromatic hydroxyl group and an aqueous solvent.

Further, the pattern formation method according to the present invention comprises applying a resist composition onto a substrate to form a resist layer; applying the above-mentioned composition for forming a top coat layer onto the above-mentioned resist layer; heating to cure the resultant; exposing the resist layer using extreme ultraviolet rays; and developing the resist layer.

Effects of the Invention

According to the present invention, what can be formed is a top coat layer that, when patterns are formed by a photolithography method using extreme ultraviolet rays, reduces influence of deep ultraviolet rays, does not cause deterioration of roughness of resist patterns and deterioration of pattern shape, can inhibit volatilization of gas from resists at the time of exposure, and further can improve sensitivity at the time of exposure. This top coat layer has a high k value (optical absorption coefficient), exhibits a high absorption rate of deep ultraviolet ray, and attains an absorption rate of deep ultraviolet ray of 90% or more. Moreover, according to the pattern formation method of the present invention, fine patterns can be accurately created without the inside of an exposure apparatus being contaminated with gas generated from the resist. Further, in cases where the composition for forming a top coat layer according to the present invention is used, fewer residues adhere to the surface of resist pattern after development. This also enables excellent patterns to be obtained.

MODE FOR CARRYING OUT THE INVENTION

Modes for carrying out the present invention will be described in detail below.
<Composition for Forming a Top Coat Layer>

The composition for forming a top coat layer according to the present invention is for forming a top coat layer that is formed onto a resist layer and comprises an aromatic compound with molecular weight of 180 to 800 having an aromatic hydroxyl group and an aqueous solvent.

The top coat layer that is formed using the composition for forming a top coat layer according to the present invention produces the following three effects.
(1) An effect of absorbing deep ultraviolet light contained in light irradiated to a resist layer upon exposure.
(2) An effect of inhibiting volatilization of gas generated in a resist layer into an atmosphere upon exposure.
(3) An effect of increasing sensitivity to extreme ultraviolet rays to an extent equal to or better than cases where a top coat layer is formed.
<Aromatic Compounds>

In the present invention, an aromatic compound has an aromatic hydroxyl group and exhibits strong absorption to deep ultraviolet light because it has a conjugated structure.

In the present invention, because the aromatic compound has an aromatic hydroxyl group, when this aromatic compound is used in the composition for forming a top coat layer, the composition for forming a top coat layer exhibits a high solubility to an alkaline aqueous solution, which allows for easy dissolution removal from the surface of resist by development treatment. Further, in cases where the top coat layer is formed using this composition, the volatilization of gas generated in the resist layer into an atmosphere is inhibited. That is, many of the aromatic hydroxyl group may form a hydrogen bond. This hydrogen bond makes the top coat layer finer; and the gas generated in the resist layer is hard to pass through the top coat layer. Further, outgas generated by exposure are protecting groups, which are contained in the resist resin released by the exposure, cations contained in photo acid generators, and amines contained in a resist composition. These are captured by aromatic hydroxyl groups. It is thought that the outgas is difficult to pass through the top coat layer because of those actions, which improves problems of the outgas.

The aromatic compound used in the present invention comprises an aromatic ring and an aromatic hydroxyl group. Here, the aromatic hydroxyl group refers to a hydroxyl group that binds directly to the aromatic ring in the aromatic compound. To be specific, it is a hydroxyl group contained in a structure such as a phenol backbone, a naphthol backbone, a hydroxyanthracene backbone, a hydroxyanthraquinone backbone, a bisphenol backbone, and a hydroxybenzopyran backbone. These backbones may have, besides the aromatic hydroxyl group, substituent groups having direct binding; and examples thereof include a carboxyl group, a sulfo group, an amino group, an amide group, a nitro group, a carboxylate ester group, and a polyalkylene oxide group. In other words, the aromatic compound in the present invention has the aromatic group having the aromatic hydroxyl group.

A specific example of the such an aromatic group having the aromatic hydroxyl group is as follows:

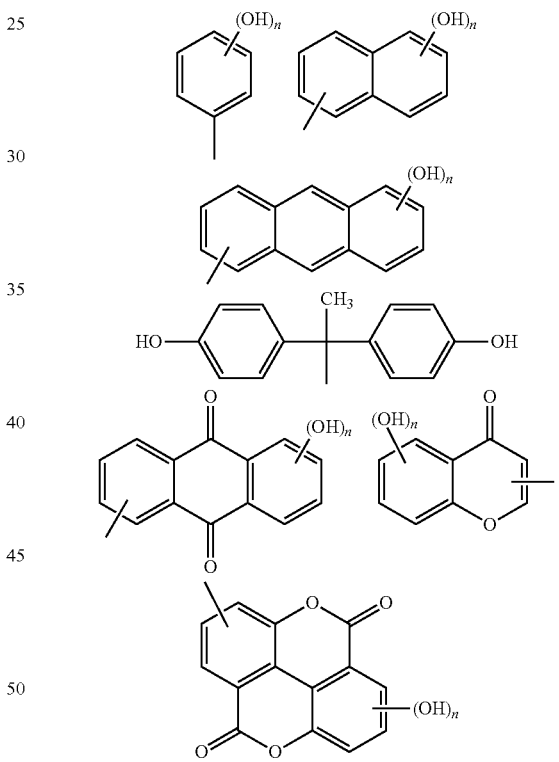

(wherein, n is an integer of one or more, which represents the number of the hydroxyl groups in each substituent group; and the upper limit of n is identical to the number of the hydrogen atoms contained in each substituent group backbone).

It is to be noted that the above aromatic group was presented as an example and a position on the ring at which the hydroxyl group and atomic bonding bind is not limited to the position shown in the above example.

In the present invention, the aromatic compound may further have a hydrophilic group that does not directly bind to an aromatic ring (hereinafter in the present invention, referred to as a non-aromatic hydrophilic group).

A composition for forming a top coat layer comprising the aromatic compound having the non-aromatic hydrophilic group exhibits a higher solubility to an alkaline aqueous solution; and further, in cases where a top coat layer is formed using this composition, an effect of inhibiting volatilization of gas generated in a resist layer into an atmosphere upon exposure become higher. Accordingly, it is thought that, as mentioned above, volatilization of the gas by the non-aromatic hydrophilic group is inhibited by the presence of the aromatic hydroxyl group; and the effect is improved further.

In the present invention, the non-aromatic hydrophilic group is selected from those that are commonly well known; and examples thereof include a hydroxyl group, a carboxyl group, a sulfo group, a nitro group, a cyano group, an amino group, an amide group, a nitro group, a carboxylate ester group, and a polyalkylene oxide group. Of these, a hydroxyl group and a carboxyl group are in particular preferred. These non-aromatic hydrophilic groups bind to the aromatic ring via a hydrocarbon chain that may contain a hetero atom such as oxygen or nitrogen. These non-aromatic hydrophilic groups as necessary can have a substituent group and can have an aliphatic hydrocarbon such as an alkyl group or an aromatic group such as a phenyl group as the substituent group. In cases where the substituent group in the non-aromatic hydrophilic group is an aromatic group, the non-aromatic hydrophilic group may produce actions as a deep ultraviolet absorbing group which is described later.

In the present invention, the aromatic compound may further have a deep ultraviolet absorbing group. In cases where a top coat layer is formed using the composition for forming a top coat layer comprising the aromatic compound having further the deep ultraviolet absorbing group, the action of absorbing deep ultraviolet light contained in light irradiated to a resist layer at the time of exposure becomes higher.

In the present invention, the deep ultraviolet absorbing group refers to a group that absorbs light with 170 to 300 nm, mainly 193 nm and 248 nm (hereinafter, may be referred to as deep ultraviolet light). Examples of such a group include an unsubstituted or substituted aromatic group, in particular, a phenyl group, a naphthyl group, and an anthracenyl group. These groups as necessary may have a substituent group. As one of the substituent groups, examples include a hydrocarbon group such as an alkyl group. Here, in order for the aromatic compound to be water-soluble and have solubility to an alkaline aqueous solution, it is preferred that the number of carbons of the hydrocarbon group be not excessively large. Usually, the number of carbons contained in such a hydrocarbon group is preferably 10 or less. Further, as the substituent group, examples also include a hydroxyl group and a carboxyl group.

Besides, substituent groups that contain an aromatic backbone such as a benzene backbone, a naphthalene backbone, or an anthracene backbone in their structure function as the deep ultraviolet absorbing group. In addition to those, ones that contain a biphenyl backbone, a pyrene backbone, a fluorene backbone, a carbazole backbone, a xanthone backbone, or a phenolphthalein backbone in their structure can be used as the deep ultraviolet absorbing group. The number of carbons contained in these groups is not particularly restricted; but it is for example preferred that the number of carbons be 6 to 15. Further, the present invention includes ones containing a porphyrin backbone, a phthalocyanine backbone, or the like as the deep ultraviolet absorbing group. The group having these backbones, including one having any substituent group, functions as the deep ultraviolet absorbing group.

It is to be noted that, in the present invention, in cases where the aromatic compound has the deep ultraviolet absorbing group, such a group may bind at any position of the aromatic compound and does not have to bind directly to the aromatic ring contained in the aromatic compound. For example, the group may bind to the aromatic ring via a linking group such as a hydrocarbon group.

In the present invention, it is preferred that the aromatic compound be not contain an element other than hydrogen, carbon, nitrogen, oxygen, and sulfur. In cases where the aromatic compound is composed of an element selected from hydrogen, carbon, nitrogen, oxygen, and sulfur, generation of outgas can be inhibited, which outgas contaminates photo masks and mirror or the like in an exposure apparatus and adversely affects sensitivity by irradiation of extreme ultraviolet light.

Various aromatic compounds can be used as the aromatic compound according to the present invention and examples thereof include the following.

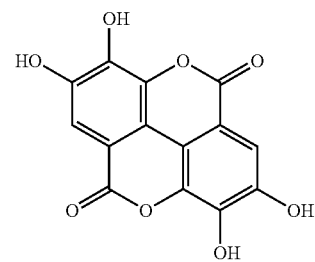

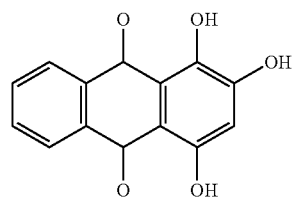

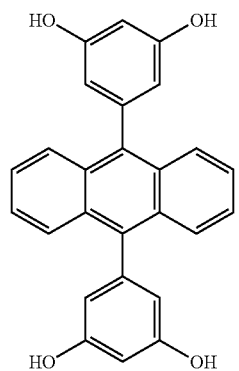

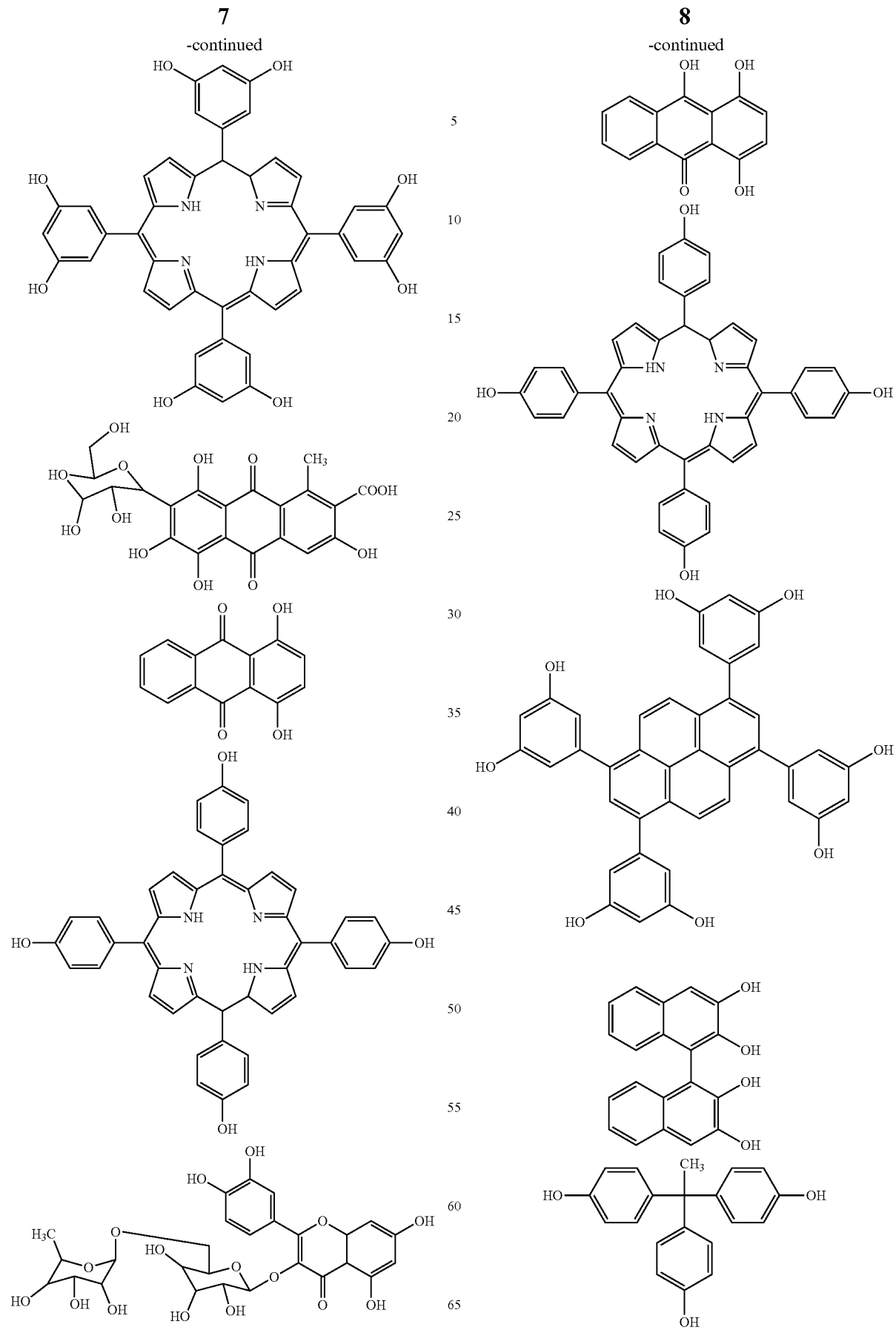

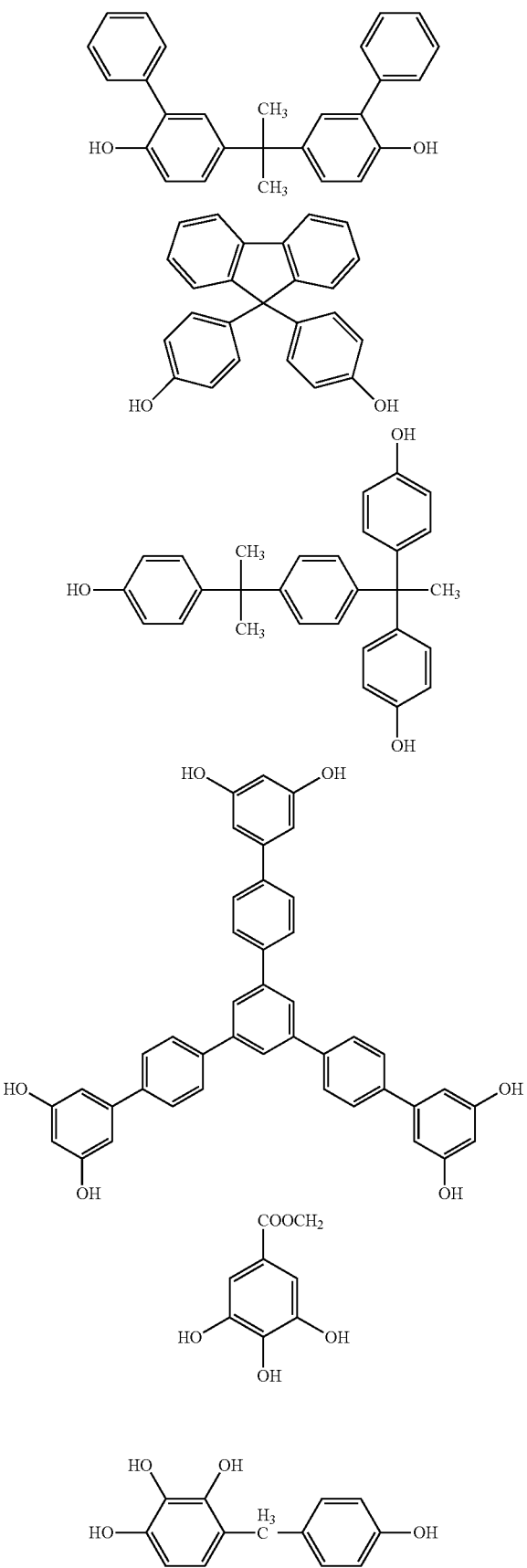

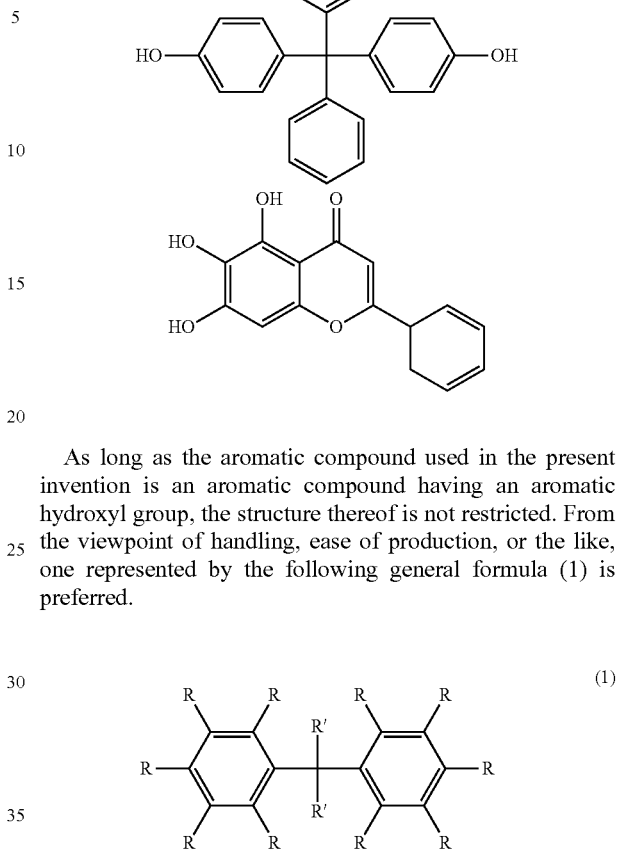

As long as the aromatic compound used in the present invention is an aromatic compound having an aromatic hydroxyl group, the structure thereof is not restricted. From the viewpoint of handling, ease of production, or the like, one represented by the following general formula (1) is preferred.

$$\text{(1)}$$

wherein, R and R' may be each independently hydrogen, a hydroxyl group, an unsubstituted or substituted hydrocarbon group having 1 to 10 carbon atoms and preferably having 1 to 6, a non-aromatic hydrophilic group, or a deep ultraviolet absorbing group having 6 to 15 carbon atoms. Note that one or more Rs in the general formula (1) are hydroxyl groups. In cases where the above-mentioned hydrocarbon group, non-aromatic hydrophilic group, and deep ultraviolet absorbing group have a substituent group, examples of that substituent group include a hydrocarbon group, a hydroxyl group, an amino group, and a sulfo group.

Further, any two of R and R' in the general formula (1) may bind together via a hydrocarbon chain to form a ring structure. Here, this hydrocarbon chain may contain a hetero atom selected from O, S, and N in the main chain. Such a hetero atom can be contained as —SO3H, —O—, —S—, —N=N—, —CO—, —SO2-, or the like in the hydrocarbon chain. Further, this hydrocarbon chain may have a further substituent group.

Further, the linking group —CR'2- that is present between two aromatic rings in the above formula (1) may be a carbonyl group —CO—. Examples of the above-mentioned substituent group of the hydrocarbon group and ring structure include a hydrophilic group and a deep ultraviolet absorbing group.

Examples of compounds that satisfy the above-mentioned general formula (1) include the following compound.

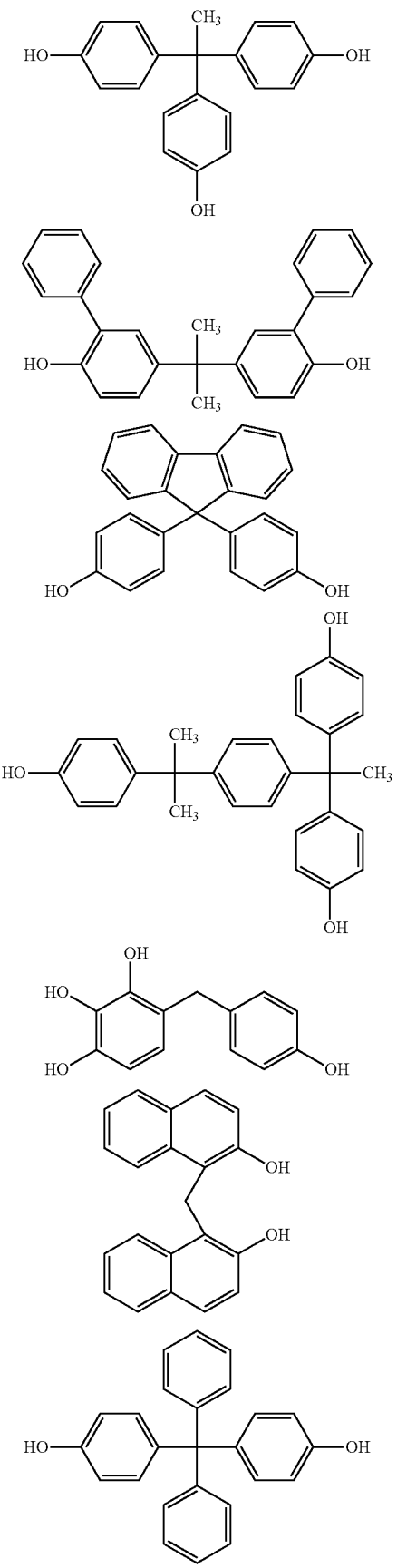
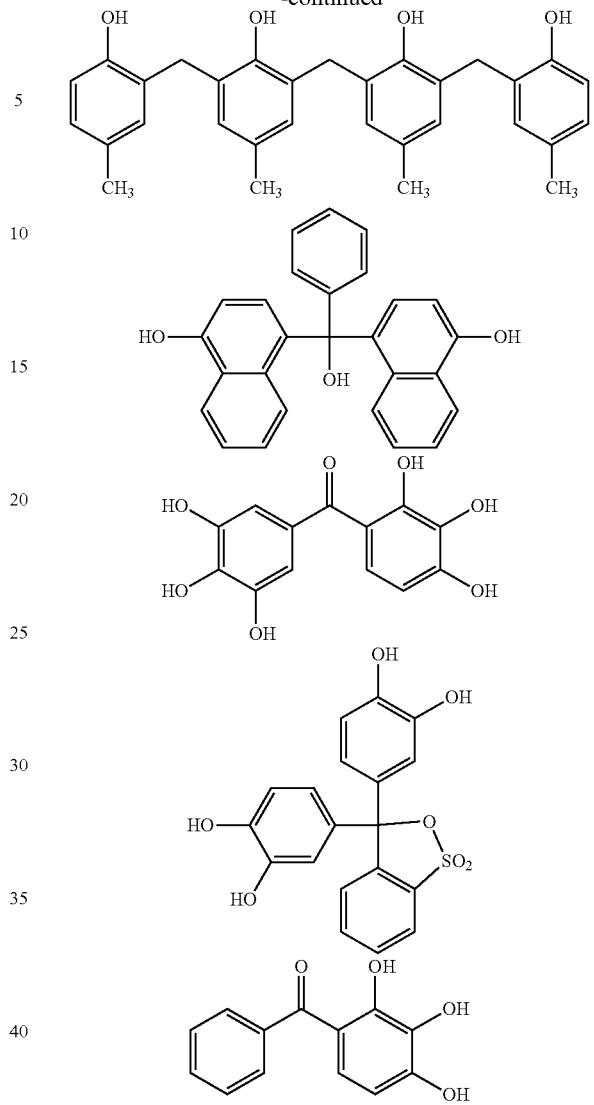

In the present invention, the aromatic compound preferably has a certain fixed molecular weight or more for the purpose of producing an effect of forming a top coat layer. Because of this, the mass average molecular weight of the aromatic compound is preferably 180 or more, more preferably 280 or more, and most preferably 300 or more. On the other hand, for the purpose of maintaining applicability of the composition for forming a top coat layer, the molecular weight is preferably a certain fixed level or less. Because of this, the mass average molecular weight of the aromatic compound is preferably 800 or less, more preferably 600 or less, and most preferably 500 or less.

In the present invention, the aromatic compound preferably has a melting point that is equal to or higher than a certain fixed temperature for the purpose of improving the applicability. Because of this, the melting point of the aromatic compound is preferably 100° C. or higher and more preferably 110° C. or higher.

The composition for forming a top coat layer according to the present invention, as described later, comprises an aqueous solvent as a solvent. Further, the formed top coat layer needs to be readily removed at the time of development treatment. Because of this, the aromatic compound used in the present invention need to have a certain fixed level or higher of solubility to water. In the present invention, the solubility of the aromatic compound to water at 25° C. is preferably 10 g/100 ml or more and more preferably 5 g/100 ml or more. It is to be noted that the solubility of the aromatic compound only need to be equal to or more than a certain fixed level and there is no upper limit.

Further, the content of the aromatic compound contained in the composition for forming a top coat layer is adjusted depending on an intended film thickness; and the content is in general preferably 0.01 to 10% by mass and more preferably 0.05 to 5% by mass based on the total mass of the composition for forming a top coat layer. When the content of compound having an aromatic hydroxyl group is excessively high, the film thickness of the formed top coat layer becomes large and absorption of extreme ultraviolet light may become large, which therefore requires careful attention.

<Aqueous Solvents>

The composition for forming a top coat layer according to the present invention comprises an aqueous solvent. The composition for forming a top coat layer according to the present invention is in general applied directly onto a resist layer. Because of this, the composition for forming a top coat layer is desirably one that does not affect the resist layer to cause deterioration of pattern shape. Because of this, aqueous solvents that have less influence to the resist layer are used. As water used in such aqueous solvents, preferred is one prepared by removing organic impurities, metals ions, and the like by distillation, ion exchange treatment, filter treatment, various adsorption treatment, or the like.

Further, for the purpose of improving the solubility of the component in the composition or the like, mixed solvents containing a small amount of the following organic solvent can also be used at an amount of 30% by mass or less based on the total mass of the above-mentioned aqueous solvent. As an organic solvent used in such mixed solvents, any of (a) hydrocarbons, for example, n-hexane, n-octane, cyclohexane, or the like, (b) alcohols, for example, methyl alcohol, ethyl alcohol, isopropyl alcohol, or the like, (c) ketones, for example, acetone, methyl ethyl ketone, or the like, and (d) esters, for example, methyl acetate, ethyl acetate, ethyl lactate, or the like, (e) ethers, for example, diethyl ether, dibutyl ether, or the like, (f) other polar solvents, for example, dimethylformamide, dimethyl sulfoxide, methyl cellosolve, cellosolve, butyl cellosolve, cellosolve acetate, alkyl cellosolve acetate, butyl carbitol, carbitol acetate, or the like can be used depending on an object. Of these, alcohol having 1 to 20 carbon atoms, in particular, methyl alcohol, ethyl alcohol, or isopropyl alcohol, is preferred because it has less influence to the resist.

Here, the water content of the aqueous solvent is preferably 70% by mass or higher and more preferably 80% by mass or higher based on the total mass of the above-mentioned aqueous solvent.

<Other Constituting Components>

In the present invention, the composition for forming a top coat layer may further contain, in addition to the aromatic compound and the solvent, a polymer as a top coat layer formation component. Hereinafter, such a polymer may be referred to as a binder polymer or simply a binder. In cases where the composition for forming a top coat layer contains the binder as the top coat layer formation component, the applicability and formation are improved to allow for formation of a more uniform top coat layer. When the top coat layer is formed using the binder as just described, relatively solid top coat layer is formed and thereby detachment of the top coat layer by physical contact or the like is inhibited, which is preferred.

It is to be noted that because the aromatic compound has the aromatic hydroxyl group in the composition for forming a top coat layer according to the present invention, even if the aromatic compound per se does not contain the binder as a coated layer formation component, the top coat layer can be formed. In cases where the top coat layer is formed using a composition for forming a top coat layer that does not contain the binder, the top coat layer is readily removed in a developing liquid. The top coat layer is formed even without a binder that is commonly used as a top coat layer formation component. That is presumably because a substituent group introduced in the aromatic compound is chemically adsorbed to the surface of resist or the aromatic compounds bind each other by interaction.

In cases where the composition for forming a top coat layer according to the present invention comprises a binder, although the binder preferably has compatibility with the aromatic compound, the binder is not particularly restricted and any binder can be selected. As the binder, naturally-occurring polymer compounds can be used; or copolymers or photopolymers which are synthetic polymer compounds having a repeating unit can also be used from the viewpoint of production stability or the like. Here, a mode of polymerization of the binder polymer is not particularly restricted. That is, a mode in which monomers are polymerized is not particularly restricted; and polymers made by any mode such as condensation polymerization, ring-opening polymerization, or addition polymerization may be used.

Various types of such binders are known and any can be selected as far as effects of the present invention are not impaired. Specific examples include phenol resins such as novolak resins, polyhydroxystyrene, polyvinyl alcohol, poly (acrylic acid), polymethacrylic acid, poly(acrylic acid) ester, poly(methyl methacrylate), polyvinyl acetate, and polyvinylpyrrolidone. In particular, examples of acrylates or methacrylates include hydroxyethyl acrylate, adducts of polyethylene oxide acrylate, hydroxyethyl methaacrylate, and adducts of polyethylene oxide methaacrylate. The molecular weight of these binders can be appropriately selected depending on an object; and the mass average molecular weight is in general preferably 8,500 to 22,000. It is to be noted that the mass average molecular weight in the present invention refers to a mass average molecular weight in terms of styrene by gel permeation chromatography.

Further, the binder preferably has a hydrophilic group which has an effect of being soluble to water. Such a hydrophilic group is commonly known well; and examples thereof include a hydroxyl group, a carboxyl group, a sulfo group, an amino group, an amide group, a nitro group, and a polyalkylene oxide group. Of these, a hydroxyl group and a carboxyl group are in particular preferred. In cases where such a hydrophilic group has a substituent group, aliphatic hydrocarbons such as alkyl groups and aromatic groups such as phenyl groups can be the substituent group. In case where the substituent group in the hydrophilic group is an aromatic group, the hydrophilic group may produce effects as a deep ultraviolet absorbing group.

Further, in cases where the composition for forming a top coat layer according to the present invention comprises the binder, the content thereof is adjusted depending on an intended film thickness or the like and is in general 0.1 to 10% by mass based on the total mass of the composition for forming a top coat layer and preferably 0.5 to 5% by mass. By the content of binder being within the above range, it can be inhibited that the film thickness of the formed top coat layer becomes excessively large and absorption of extreme ultraviolet light increases.

In cases where the composition for forming a top coat layer according to the present invention comprises the binder, polymers having a deep ultraviolet absorbing group can be used as the binder for the purpose of supplementing the effect of absorbing deep ultraviolet rays of the aromatic compound.

Further, the composition for forming a top coat layer according to the present invention, as necessary, can contain a basic compound as far as the effect of the present invention is not impaired. In cases where the aromatic compound has acid group, these basic compounds can act on that acid group to form salts and improve the solubility. That is, by using the basic compound, the content of the aromatic compound in the composition increases, which allows for formation of a top coat layer with larger film thickness. Examples of such a basic compound include ammonia, alkanolamines such as monoethanolamine, amines such as alkyl amines or aromatic amines, and tetramethylammonium hydroxide.

The composition for forming a top coat layer according to the present invention may further comprise other additives. Here, these components are used for the purpose of improving the applicability of the composition onto the resist, improving physical properties of the formed top coat layer, or the like. As one example of these additives, surfactants are included. Examples of the type of surfactant used include, but are not limited to, (a) anionic surfactant, for example, alkyl diphenyl ether disulfonic acid, alkyl diphenyl ether sulfonic acid, alkyl benzenesulfonic acid, polyoxyethylene alkyl ether sulfuric acid, and alkyl sulfuric acid and ammonium salts or organic amine salts thereof, and the like; (b) cationic surfactant, for example, hexadecyltrimethylammonium hydroxide and the like; (c) non-ionic surfactant, for example, polyoxyethylene alkyl ether (to be more specific, polyoxyethyl lauryl ether, polyoxyethylene oleyl ether, polyoxyethylene cetyl ether, and the like), polyoxyethylene fatty acid diester, polyoxyethylene fatty acid monoester, polyoxyethylene polyoxypropylene block copolymer, acetylene glycol derivatives, and the like; and (d) amphoteric surfactant, for example, 2-alkyl-N-carboxymethyl-N-hydroxyethyl imidazoliumbetaine, laurylamidepropyl hydroxy sulfonebetaine, and the like. Further, as for other additives, thickeners, coloring agents such as dyes, acids, bases, and the like can be used as the additive. The amount of these additives added is determined in consideration of effects of each of the additives or the like; and is in general 0.01 to 1% by mass based on the mass of the entire composition and preferably 0.1 to 0.5% by mass.

<Pattern Formation Method>

The composition for forming a top coat layer according to the present invention can be used in the same manner as conventional compositions for forming a top coat layer and compositions for forming a top anti-reflective layer. In other words, when the composition for forming a top coat layer according to the present invention is used, production steps do not have to go through a major change. To be specific, a pattern formation method using the composition for forming a top coat layer according to the present invention is described as follows.

First, the resist composition is applied onto the surface of substrate such as a silicon substrate or a glass substrate, which is as necessary pretreated, by a conventionally known method of application such as a spin coating method to form a resist composition layer. Before the application of the resist composition, a lower layer may be coated and formed in a lower layer of the layer. Such a lower layer can in general improve adhesion between the resist layer and the substrate. Further, by forming a layer containing transition metals or oxides thereof as the resist lower layer, reflected light can be increased to improve exposure margin as well.

For the pattern formation method of the present invention, any resist composition can be used among resist compositions having sensitivity to extreme ultraviolet rays. In the present circumstances, resist compositions for deep ultraviolet rays, for example, photoresist compositions for ArF laser or photoresist compositions for KrF laser are commonly used. The resist composition that can be used for the pattern formation method of the present invention is not restricted; and any can be selected as long as it has sensitivity to extreme ultraviolet rays. But, examples of preferred resist compositions include in particular positive type or negative type chemically amplified resist compositions.

Further, regardless of being the positive type or negative type, the chemically amplified resist composition can be used for the pattern formation method of the present invention.

A chemically amplified resist is one obtained by generating acids by radiation and changing the solubility of irradiated parts to a developing liquid through chemical change by catalytic actions of the acid to form patterns. Examples thereof include one composed of an acid generating compound that generates by radiation and a resin containing an acid sensitive group that generates an alkali soluble group such as a phenolic hydroxyl group or a carboxyl group upon degradation in the presence of the acid, and one composed of an alkali soluble resin, a cross-linking agent, and an acid generator.

The composition for forming a top coat layer according to the present invention is applied onto the resist layer applied onto the substrate by a spin coating method or the like. The thus formed resist composition layer and a layer of composition for forming a top coat layer are heated to evaporate a solvent. By this heating, the resist layer and top coat layer can be formed. The heating is carried out by, for example, using a hot plate or the like.

A heating temperature is selected depending on the type of solvent contained in the composition. To be specific, the heating temperature is in general 25 to 150° C., preferably 80 to 130° C., and more preferably 90 to 110° C. At this time, the thickness of the formed top coat layer is in general 1 to 100 nm and preferably 5 to 50 nm.

It is to be noted that the resist layer can be heated alone after the resist layer is applied and thereafter the composition for forming a top coat layer can be applied and heated.

The thus formed top coat layer has a high transmittance of extreme ultraviolet rays. In general, the transmittance of extreme ultraviolet rays is barely affected by the substituent group of the aromatic compound or the like; and the influence of elemental species is relatively more potent. Because carbon or hydrogen which is a major constituent element of the top coat layer has less absorption of extreme ultraviolet rays, the top coat layer in general exhibits transmittance enough to achieve the effect of the present invention. To be specific, the transmittance to light with a wavelength of 13.5 nm is preferably 80% or more and more preferably 85% or more. On the other hand, the thus formed top coat layer exhibits a low transmittance of deep ultraviolet rays. To be specific, the transmittance to light with a wavelength of 248 nm is more preferably 20% or less and more preferably 15% or less.

The top coat layer formed using the composition for forming a top coat layer according to the present invention preferably has a k value of 0.84 or more at a wavelength of at least either one of 193 nm or 248 nm and more preferably a k value of 0.88 or more.

The resist layer is thereafter exposed to extreme ultraviolet rays, for example, light with a wavelength of 5 to 20 nm, in particular, light with a wavelength of 13.5 nm, through the top coat layer as required, via a mask.

After the exposure, heating after exposure is as required carried out and then development is carried out by method, for example, puddle development or the like to form a resist pattern. The development of the resist layer is usually carried out using an alkaline developing liquid. Here, because a water soluble polymer contained in the composition for forming a top coat layer according to the present invention has a hydrophilic group, the polymer is readily removed by the developing liquid.

Because of this, in the present invention, the removal of the top coat layer and development of the resist can be carried out at the same time by performing development treatment using the alkaline developing liquid without performing special treatment. However, it is also feasible to remove the top coat layer using an aqueous solvent such as water and thereafter separately develop the resist using alkaline developing liquid.

As the alkaline developing liquid used in the development, an aqueous solution or water-based solution of sodium hydroxide, tetramethylammonium hydroxide (TMAH), or the like is for example used. After the development treatment, the resist pattern is rinsed (washed) as necessary using a rinse liquid, preferably pure water. It is to be noted that the formed resist pattern is used as a resist for etching, plating, ion diffusion, staining treatment, or the like and thereafter as required removed.

The film thickness or the like of the resist pattern is appropriately selected depending on application use or the like; and a film thickness of in general 0.1 to 150 nm and preferably 20 to 80 nm is selected.

The resist pattern obtained by the pattern formation method according to the present invention is continuously subjected to processing depending on application use. At that time, there is no particular limitation ascribed to the use of pattern formation method according to the present invention, the processing can be carried out by a commonly-used method.

EXAMPLES

The present invention will be described using various examples as follows.

Examples 101 to 109

Aromatic compounds having various substituent groups were combined as shown in Table 1. This aromatic compound was dissolved in pure water or a water/isopropanol mixed solvent (isopropanol content of 30% by mass) such that the content of the aromatic compound is 3% by mass to prepare a composition for forming a top coat layer.

Onto a substrate, a resist composition was applied by spin coating such that the film thickness is 40 nm. As the resist composition, SEVR-337 (trade name, manufactured by Shin-Etsu Chemical Co.) was used. After the resist composition was applied, each of the compositions for forming a top coat layer was further applied by spin coating such that the film thickness is 30 nm. After the application, the resultant was heated at 95° C. fr 60 seconds to obtain a resist layer coated with a top coat layer. The obtained resist layer was exposed for image using New Subaru electron storage ring of SPring-8 and developed for 30 seconds with a 2.38% tetramethylammonium hydroxide aqueous solution; and residues were evaluated. The obtained results are as shown in Table 1.

TABLE 1

| Example Number | Aromatic Compound Combination Ratio (% by mass) | | | | | Film Surface Residues |
|---|---|---|---|---|---|---|
| | a | b | c | d | e | |
| Example 101 | 100 | | | | | None |
| Example 102 | | 100 | | | | None |
| Example 103 | | | 100 | | | None |
| Example 104 | | | | 100 | | None |
| Example 105 | | | | | 100 | None |
| Example 106 | 50 | 50 | | | | None |
| Example 107 | 50 | | 50 | | | None |
| Example 108 | | 50 | | 50 | | None |
| Example 109 | | | 50 | | 50 | None |

As for each of the compounds a-e in the table, the following was used (the same is applied in Examples 2 to 6 below).

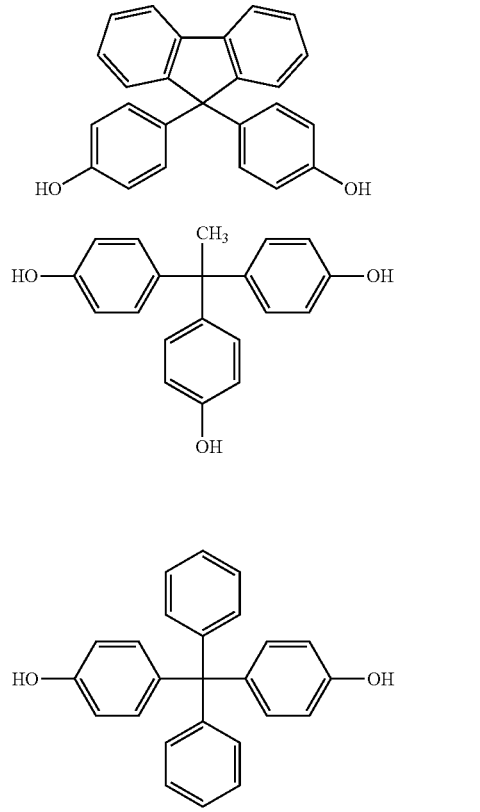

-continued

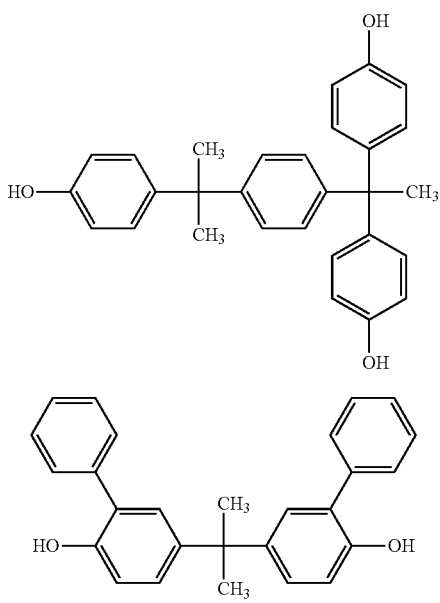

Comparative Examples 201 and 202 and Examples 201 to 210

A resist layer was obtained in the same manner as described in Example 101 except that a composition for forming a top coat layer was changed to one shown in Table 2. The obtained resist layer was exposed for image using New Subaru electron storage ring of SPring-8 and developed for 30 seconds with a 2.38% tetramethylammonium hydroxide aqueous solution; and an amount of exposure to $E_0$ (mJ/cm2) was measured. The obtained results are as shown in Table 2.

TABLE 2

| Example Number | Aromatic Compound Combination Ratio (% by mass) | | | | | Polymer Combination Ratio (% by mass) | Exposure Amount E0 (mJ/cm2) |
| --- | --- | --- | --- | --- | --- | --- | --- |
| | a | b | c | d | e | P0 | |
| Example 201 | 100 | | | | | | 3 |
| Example 202 | | 100 | | | | | 2 |
| Example 203 | | | 100 | | | | 2 |
| Example 204 | | | | 100 | | | 2 |
| Example 205 | | | | | 100 | | 1 |
| Example 206 | 50 | 50 | | | | | 3 |
| Example 207 | 50 | | 50 | | | | 3 |
| Example 208 | 50 | | | 50 | | | 3 |
| Example 209 | 50 | | | | 50 | | 2 |
| Example 210 | | 50 | | 50 | | | 2 |
| Comparative Example 201 | | | No upper layer | | | | 3 |
| Comparative Example 202 | | | | | | 100 | 5 |

P0: anthracene methyl-methyl methacrylate (AMMA)/methyl methacrylate (MMA) = 5/95

Comparative Example 301 and Examples 301 to 311

A resist layer was obtained in the same manner as described in Example 101 except that a composition for forming a top coat layer was changed to one shown in Table 3. While each of the resist layers was exposed to extreme ultraviolet rays, a change in pressure in an exposure chamber $\Delta P$ ($\times 10^{-7}$ Pa) between before and after the exposure was measured. The obtained results are as shown in Table 3.

TABLE 3

| Example Number | Aromatic Compound Combination Ratio (% by mass) | | | | | $\Delta P$ ($\times 10^{-7}$ Pa) |
| --- | --- | --- | --- | --- | --- | --- |
| | a | b | c | d | e | |
| Example 301 | 100 | | | | | 0.50 |
| Example 302 | | 100 | | | | 0.60 |
| Example 303 | | | 100 | | | 0.60 |
| Example 304 | | | | 100 | | 0.60 |
| Example 305 | | | | | 100 | 0.60 |
| Example 306 | 50 | 50 | | | | 0.50 |
| Example 307 | 50 | | 50 | | | 0.50 |
| Example 308 | 50 | | | 50 | | 0.50 |
| Example 309 | 50 | | | | 50 | 0.50 |
| Example 310 | | 50 | | 50 | | 0.60 |
| Example 311 | | | 50 | | 50 | 0.60 |
| Comparative Example 301 | | | No top layer | | | 1.70 |

Comparative Example 401 and Examples 401 to 416

As the aromatic compound, the above-mentioned compounds a, b, c, d, and e were provided.
Further, the following polymer was used as a binder.
P1: (polyhydroxystyrene (mass average molecular weight 12,000))
P2: (novolak resin (mass average molecular weight 8,500))
P3: (polyvinyl alcohol (mass average molecular weight 22,000))
P4: (poly(acrylic acid) (mass average molecular weight 11,000))

A resist layer was obtained in the same manner as described in Example 101 except that a composition for forming a top coat layer and a binder were changed to one shown in Table 4. At that time, applicability were evaluated visually or using a film thickness meter.
Evaluation criteria were as follows:
A: The resist layer was applicable; and in-plane uniformity of film thickness was excellent as well.

B: The resist layer was applicable; and in-plane uniformity of film thickness was slightly inferior; but sufficient practicability was noted.
C: The resist layer was applicable; and inferior in-plane uniformity of film thickness was confirmed; but the layer was usable.
D: The resist layer was not applicable.

Further, with regard with the obtained resist layer, an amount of exposure $E_0$ (mJ/cm2) was measured and residues on the surface of the layer were evaluated. Each of the obtained results is shown in Table 4.

As for the compounds f to i and A in the table were, the following were used.

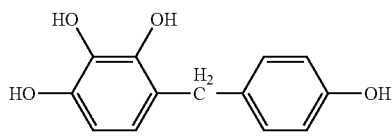

f

TABLE 4

| Example Number | Aromatic Compound Combination Ratio (% by mass) | | | | | Polymer Combination Ratio (% by mass) | | | | Exposure Amount E0 (mJ/cm2) | Application Effect | Film Surface Residues |
|---|---|---|---|---|---|---|---|---|---|---|---|---|
| | a | b | c | d | e | P1 | P2 | P3 | P4 | | | |
| Example 401 | 100 | | | | | | | | | 3 | B | None |
| Example 402 | | 100 | | | | | | | | 2 | C | None |
| Example 403 | | | 100 | | | | | | | 2 | B | None |
| Example 404 | | | | 100 | | | | | | 2 | C | None |
| Example 405 | | | | | 100 | | | | | 1 | B | None |
| Example 406 | 50 | | | | | 50 | | | | 4 | A | None |
| Example 407 | 50 | | | | | | 50 | | | 5 | A | None |
| Example 408 | 50 | | | | | | | 50 | | 5 | B | None |
| Example 409 | 50 | | | | | | | | 50 | 6 | B | None |
| Example 410 | | 50 | | | | 50 | | | | 4 | A | None |
| Example 411 | | | 50 | | | 50 | | | | 5 | A | None |
| Example 412 | | | | 25 | 25 | 50 | | | | 4 | A | None |
| Comparative Example 401 | | | No upper layer | | | | | | | 3 | — | — |
| Comparative Example 402 | | | | | | 100 | | | | 6 | A | None |
| Comparative Example 403 | | | | | | | 100 | | | 7 | A | None |
| Comparative Example 404 | | | | | | | | 100 | | 7 | A | None |
| Comparative Example 405 | | | | | | | | | 100 | 9 | A | None |

Comparative Example 501 and Examples 501 and 502

A composition for forming a top coat layer was formed by spin coating so as to have a thickness of 30 nm; and optical transparency was evaluated. To be specific, an absorption coefficient was determined by a spectroscopic ellipsometer analysis method and a k value at a wavelength of 193 nm and 248 nm was calculated.

The obtained results are as shown in Table 5.

TABLE 5

| Example Number | Aromatic Compound Combination Ratio (% by mass) | | | | | | | | | k value | |
|---|---|---|---|---|---|---|---|---|---|---|---|
| | a | b | c | d | f | g | h | i | A | 193 nm | 248 nm |
| Example 501 | 100 | | | | | | | | | 0.88 | 0.4 |
| Example 502 | | 100 | | | | | | | | 1.02 | 0.05 |
| Example 503 | | | 100 | | | | | | | 1.01 | 0.09 |
| Example 504 | | | | 100 | | | | | | 0.96 | 0.04 |
| Example 505 | | | | | 100 | | | | | 0.99 | 0.05 |
| Example 506 | | | | | | 100 | | | | 0.85 | 0.01 |
| Example 507 | | | | | | | 100 | | | 0.32 | 0.87 |
| Example 508 | | | | | | | | 100 | | 0.22 | 0.96 |
| Comparative Example 501 | | | | | | | | | 100 | 0.81 | 0.37 |

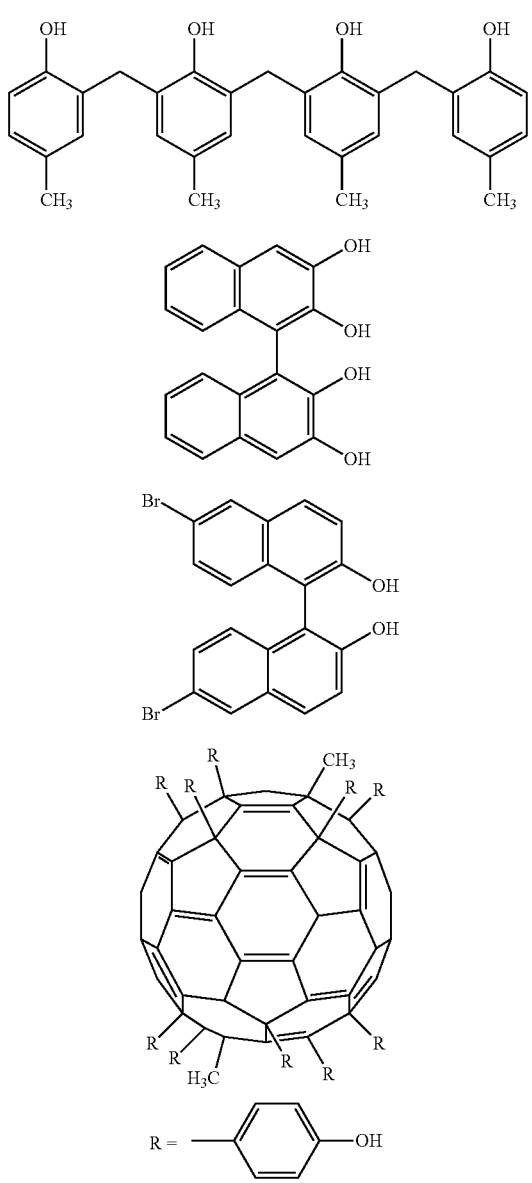

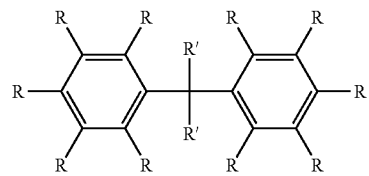

The invention claimed is:

1. A pattern formation method comprising applying a resist composition onto a substrate to form a resist composition layer; applying the composition for forming a top coat layer onto said resist composition layer
wherein said composition for forming a top coat layer comprises an aromatic compound with molecular weight of 180 to 800 having an aromatic hydroxyl group and an aqueous solvent; heating to form a resist layer and a top coat layer; exposing said resist layer through the top coat layer using an extreme ultraviolet ray; and developing the resist layer using an alkaline aqueous solution.

2. The pattern formation method according to claim 1, wherein said aromatic compound comprises a structure selected from the group consisting of phenol backbones, naphthol backbones, hydroxyanthracene backbones, hydroxyanthraquinone backbones, bisphenol backbones, and hydroxybenzopyran backbones.

3. The pattern formation method according to claim 1, wherein said aromatic compound further has a non-aromatic hydrophilic group.

4. The pattern formation method according to claim 3, wherein said non-aromatic hydrophilic group is selected from the group consisting of hydroxyl groups, carboxyl groups, sulfo groups, nitro groups, cyano groups, amino groups, amide groups, nitro groups, carboxylate ester groups, and polyalkylene oxide groups.

5. The pattern formation method according to claim 1, wherein said aromatic compound further has a deep ultraviolet absorbing group.

6. The pattern formation method according to claim 5, wherein said deep ultraviolet absorbing group is an aromatic group.

7. The pattern formation method according to claim 1, wherein the melting point of said aromatic compound is 100° C. or higher.

8. The pattern formation method according to claim 1, wherein said aromatic compound does not contain an atom other than hydrogen, carbon, nitrogen, oxygen, and sulfur.

9. The pattern formation method according to claim 1, wherein said aromatic compound is represented by the following general formula (1):

(wherein, R and R' may be each independently hydrogen, a hydroxyl group, an unsubstituted or substituted hydrocarbon group having 1 to 10 carbon atoms, a non-aromatic hydrophilic group, or an unsubstituted or substituted deep ultraviolet absorbing group having 6 to 15 carbon atoms, or any two of R and R' may bind together via a hydrocarbon chain that contain a hetero atom in a main chain to form a ring structure, wherein said ring structure may have a further substituent group, with the proviso that one or more Rs are hydroxyl groups).

10. The pattern formation method according to claim 1, wherein the content of said aromatic compound is 0.01 to 10% by mass based on the total mass of said composition for forming a top coat layer.

11. The pattern formation method according to claim 1, which composition further comprises a binder polymer.

12. The pattern formation method according to claim 11, which said binder polymer has said deep ultraviolet absorbing group.

13. A pattern formation method according to claim 1, wherein the wavelength of said extreme ultraviolet ray is 5 to 20 nm.

14. The pattern formation method according to claim 1, wherein the film thickness of the top coat layer is 1 to 100 nm.

15. The pattern formation method according to claim 1, wherein heating temperature at the said heating is 25 to 150° C.

16. The pattern formation method according to claim 1, wherein the content of the aromatic compound contained in the composition is 0.01 to 10 percent by mass based on the total mass of the composition for forming a top coat layer.

17. The pattern formation method according to claim 1, wherein the water content of the aqueous solvent is 70 percent by mass or higher based on the total mass of the aqueous solvent.

18. The pattern formation method according to claim 1, wherein the composition for forming a top coat layer according to the present invention further comprises an additive.

19. The pattern formation method according to claim 18, wherein the additive is surfactants, thickeners, coloring agents, acids, or bases and the additives added is 0.01 to 1 percent by mass based on the mass of the entire composition.

* * * * *